(12) United States Patent
Bolatkale et al.

(10) Patent No.: US 12,301,249 B2
(45) Date of Patent: May 13, 2025

(54) OPERATING AN ANALOG-TO-DIGITAL CONVERTER DEVICE

(71) Applicant: NXP B.V., Eindhoven (NL)

(72) Inventors: Muhammed Bolatkale, Delft (NL); Lucien Johannes Breems, Waalre (NL); Pierluigi Cenci, Helmond (NL); Shagun Bajoria, Eindhoven (NL); Mohammed Abo Alainein, Rotterdam (NL)

(73) Assignee: NXP B.V., Eindhoven (NL)

( * ) Notice: Subject to any disclaimer, the term of this patent is extended or adjusted under 35 U.S.C. 154(b) by 260 days.

(21) Appl. No.: 18/310,184

(22) Filed: May 1, 2023

(65) Prior Publication Data
US 2023/0361781 A1 Nov. 9, 2023

(30) Foreign Application Priority Data
May 5, 2022 (EP) ..................... 22171861

(51) Int. Cl.
| H03M 1/14 | (2006.01) |
| H03M 1/06 | (2006.01) |
| H03M 1/12 | (2006.01) |
| H03M 1/16 | (2006.01) |
| H03M 1/66 | (2006.01) |
| H03M 1/74 | (2006.01) |

(52) U.S. Cl.
CPC ........... *H03M 1/14* (2013.01); *H03M 1/0673* (2013.01); *H03M 1/12* (2013.01); *H03M 1/662* (2013.01); *H03M 1/164* (2013.01); *H03M 1/742* (2013.01)

(58) Field of Classification Search
CPC ........ H03M 1/14; H03M 1/662; H03M 1/164; H03M 1/742; H03M 1/0673; H03M 1/12
USPC .......................................... 341/126, 155, 161
See application file for complete search history.

(56) References Cited

U.S. PATENT DOCUMENTS

| 6,466,153 B1 * | 10/2002 | Yu ........................ H03M 1/0673 341/161 |
| 7,233,276 B1 * | 6/2007 | Huang .................. H03M 1/066 341/118 |
| 10,432,210 B1 | 10/2019 | Vendluri et al. |

OTHER PUBLICATIONS

Chung, Y., "A 12-bit 8.47-fJ/Conversion-Step Capacitor-Swapping SAR ADC in 110-nm CMOS", IEEE Transactions on Circuits and Systems—I: Regular Papers, vol. 62, No. 1, Jan. 2015.

Fradette, F., "Dynamic Stage Element Matching (DSEM) in Pipeline Analog to Digital Converters (ADC)", 2012 IEEE International Conference on IC Design & Technology, May 30, 2012-Jun. 1, 2012.

(Continued)

*Primary Examiner* — Khai M Nguyen

(57) ABSTRACT

There is described an analog-to-digital converter, ADC, device (100), comprising:
i) a first converter stage (110), comprising a first digital-to-analog converter, DAC, (115), comprising at least two first unit elements (116, 117, 118) each with a first unit element value (U11, U12, U13);
ii) a second converter stage (120), comprising a second DAC (125), comprising at least two second unit elements each with a second unit element value (U21, U22, U23); and
iii) a control device (180), coupled to the first DAC (115) and the second DAC and configured to:
swap at least one of the first unit element values (U1) with at least one of the second unit element values (U2) to obtain corresponding third unit element values (U3) and forth unit element values (U4).

20 Claims, 7 Drawing Sheets

(56) References Cited

OTHER PUBLICATIONS

Galton, I., "Why Dynamic-Element-Matching DACs Work", IEEE Transactions on Circuits and Systems—II: Express Briefs, vol. 57, No. 2, Feb. 2010.
Kim, J., "Flexible-Assignment Calibration Technique for Mismatch-Constrained Digital-to-Analog Converters", IEEE Transactions on Very Large Scale Integration (VLSI) Systems, vol. 22, No. 9, Sep. 2014.
Kuo, C., "Capacitor-Swapping Cyclic A/D Conversion Techniques With Reduced Mismatch Sensitivity", IEEE Transactions on Circuits and Systems—II: Express Briefs, vol. 55, No. 12, Dec. 2008.
Manivannan, S., "A 65-nm CMOS Continuous-Time Pipeline ADC Achieving 70-dB SNDR in 100-MHz Bandwidth", IEEE Solid-State Circuits Letters, vol. 4, Apr. 8, 2021.
Shibata, H., "An 800MHZ-BW VCO-Based Continuous-Time Pipelined ADC with Inherent Anti-Aliasing and On-Chip Digital Reconstruction Filter", 2020 IEEE International Solid-State Circuits Conference (ISSCC), Feb. 16-20, 2020.

\* cited by examiner

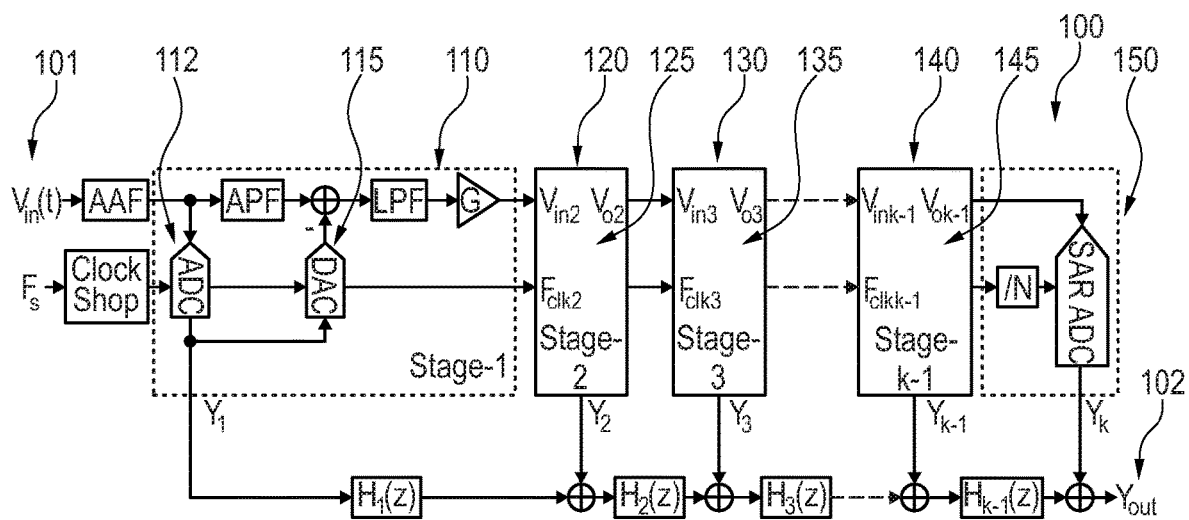
Fig. 1
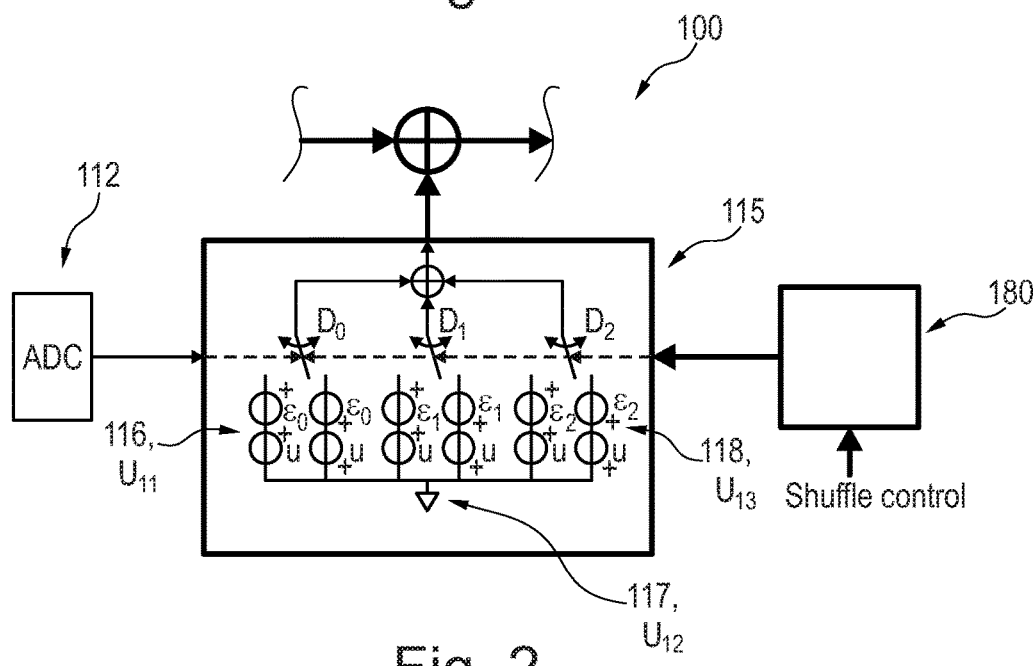
Fig. 2
$$DAC_{array} = \begin{bmatrix} U_{11} & U_{12} & U_{13} \\ U_{21} & U_{22} & U_{23} \end{bmatrix} \begin{matrix} \leftarrow U_1 \\ \leftarrow U_2 \end{matrix}$$
Fig. 3a
$$\rightarrow DAC_{array} \atop Swap = \begin{bmatrix} U_{21} & U_{12} & U_{13} \\ U_{11} & U_{22} & U_{23} \end{bmatrix} \begin{matrix} \leftarrow U_3 \\ \leftarrow U_4 \end{matrix}$$
Fig. 3b

OPERATING AN ANALOG-TO-DIGITAL CONVERTER DEVICE

CROSS-REFERENCE TO RELATED APPLICATIONS

This application claims the priority under 35 U.S.C. § 119 of European Patent application no. 22171861.2, filed on 5 May 2022, the contents of which are incorporated by reference herein.

TECHNICAL FIELD

The present disclosure relates to an analog-to-digital converter (ADC) device, comprising at least a first converter stage with a first digital-to-analog converter (DAC) and a second converter stage with a second DAC. Further, the present disclosure relates to a method of operating the ADC device. Furthermore, the present disclosure relates to a use of a swap of unit element values from different DACs to linearize the DACs and minimize the gain errors, in particular in the context of an ADC device.

TECHNICAL BACKGROUND

Analog-to-digital converters (ADCs) are configured to convert an analog input signal into a digital output signal. Advanced ADCs, such as for example a pipeline converter or a sigma-delta converter, comprise a plurality of converter stages for providing a high conversion quality. Each stage can comprise a feedback or feedforward path with a digital-to-analog converter (DAC), that converts back an analog signal to a digital signal for regulating the analog-to-digital conversion of the ADC. Each DAC can hereby comprise at least two DAC circuit elements (so called unit elements).

However, mismatch in the DAC unit elements, in particular introduced during circuit fabrication, can cause the DAC output levels to deviate from their nominal values. Specifically, continuous time (CT) pipeline converters may be very sensitive to the errors that can arise from the DAC unit elements. This holds in particular true for the converter stages arranged close to a front-end circuitry. The mismatch in the DAC unit elements can cause harmonic distortion and leak quantization errors of said front-end converter stages to the ADC output. This drawback may degrade the linearity performance of the converter. However, since a high linearity may be desired or even mandatory, an accurate matching of the DAC unit elements may be required.

Several techniques have been described to linearize the transfer function of the DAC, such as dynamic element matching (DEM), in which the DAC unit elements are selected randomly for each input code to break the correlation between the DAC error and its input. As a result, the harmonic distortion introduced by the DAC is transformed into white noise. Nevertheless, the error power lying within the signal band will increase the noise floor of the converter in this case.

A further example of linearization may be seen in data weighted averaging (DWA), where the DAC unit elements are selected rotationally such that the power of the DAC error is shifted to higher frequencies in order to minimize the increase of the in-band noise floor of the converter.

Yet, another example would be DAC unit element selection algorithms that linearize the DAC under the assumption that the resulted linear gain error is acceptable. This might be valid in some applications. However, in applications such as the CT pipeline converter, the different linear gain error of the coarse DACs (front-end converter stages) leaks the quantization errors of the coarse ADCs to the output and therefore, degrades the linearity performance of the converter.

OBJECT AND SUMMARY OF THE DISCLOSURE

There may be a need to operate an ADC device in an accurate and reliable manner. An ADC device, a method of operating an ADC device, and a use of a specific swap technique are described.

According to a first aspect of the present disclosure, there is described an analog-to-digital converter (ADC) device (in particular a CT pipeline converter), comprising:

i) a first converter stage, comprising a first digital-to-analog converter (DAC) that comprises at least two first unit elements (DAC circuits) each with a first unit element value (in other words: each first unit element is associated with a respective first unit element value, in case of three first unit elements there will be three first unit element values);

ii) a second converter stage (in particular arranged subsequent to the first converter stage in a conversion downstream direction), comprising a second DAC that comprises at least two second unit elements each with a second unit element value (in other words: each second unit element is associated with a respective second unit element value); and iii) a control device, coupled to the first DAC and the second DAC and configured to:
(in particular obtain/apply the first unit element values (for example three) and the second unit element values (e.g. three), and)
swap at least one of the first unit element values with at least one of the second unit element values (for example, the unit element values are arranged in form of an array and at least two values from different converter stages are swapped) to obtain corresponding third unit element values and forth unit element values (since there has been at least one change in the first unit element values and in the second unit element values, they are now different and can now be termed third unit element values and fourth unit element values, respectively).

According to a second aspect of the present disclosure, there is described a method of operating an ADC device having a first digital-to-analog converter in a first converter stage, the first DAC comprising at least two first unit elements each with a first unit element value, and a second DAC in a second converter stage, the second DAC comprising at least two second unit elements each with a second unit element value, the method comprising:

i) providing (obtaining) the first unit element values and the second unit element values, and ii) swapping at least one of the first unit element values with at least one of the second unit element values to obtain third unit element values and forth unit element values.

According to a third aspect of the present disclosure, there is described a use (method of using) of a swap of unit element values from (at least two) different DACs (of different converter stages) to linearize the DACs and minimize the gain errors, in particular in the context of an ADC device.

In this context, the term "control device" may in particular refer to any hardware and/or software configured to perform the described swap operation with respect to the DACs of different converter stages. In an example, the control device may be a processor or a plurality of processors. Further, a control device may be a control system of an ADC device or a software implemented on an ADC device control system. In a specific example, no hardware is added to an existing ADC converter and a control software is implemented on the existing control device (controller), which then becomes the described control device. In a further example, the control device can be remote with respect to the ADC device.

In this context, the term "swap" may in particular refer to an operation suitable to exchange at least one unit element value form a first DAC with at least one unit element value from a second DAC. Several examples are described in the following, how such a swap operation may be performed. In one example, the unit element values of all DACs are randomly swapped, while in another example only unit element values from the front-end DACs are randomly swapped.

In this context, the term "unit element" may in particular refer to a circuit of a DAC. In particular, unit elements may be considered as equal-value current sources in a DAC.

According to an exemplary embodiment, the present disclosure may be based on the idea that an ADC device can be operated in an accurate and reliable manner, when the unit element values of the DAC from different converter stages are swapped, in particular randomly.

In a conventional DEM technique (see above), only the unit element values of each DAC are selected randomly (in other words intra DAC). However, it has been surprisingly found by the inventors (see FIGS. 6 to 13) that the results may be significantly improved, when the unit element values of different DACs (in other words inter DAC) are swapped (in particular randomly selecting the unit element values of each DAC for each input code).

To illustrate this concept, it is described here an example with two front-end converter stages, each of two bits. The first converter stage DAC is built from three unit elements DAC_1=[U11 U12 U13] and similarly, the unit elements of the second converter stage DAC are DAC_2=[U21 U22 U23]. In the conventional DEM technique, if the input code is K, then the output of DAC_1 is built up by randomly selecting K unit elements from the DAC_1 unit elements. Similarly, the output of DAC_2 is built up by randomly selecting K unit elements from the DAC_2 unit elements. In the following, the unit element values are illustrated as an array:

$$DAC_{array} = \begin{bmatrix} U_{11} & U_{12} & U_{13} \\ U_{21} & U_{22} & U_{23} \end{bmatrix}$$

However, according to the present disclosure, the unit elements of DAC_1 and DAC_2 are combined, for example the output of DAC_1 is built up by randomly selecting K unit element values from the DAC array. Similarly, the output of DAC_2 is built up by randomly selecting K unit element values from the DAC array.

An exemplary example of the described technique is described in the following. The linear gain error of the DACs leak the quantization errors to the output. If each DAC has a linear gain error e, the linear gain error of the first DAC is $e_1$ and the linear gain error of the second DAC is $e_2$, etc. Then, the output can be given by:

$$V_{out} = G^4 V_{in}(1 - e_1 + e_1 e_2 - e_1 e_2 e_3 + e_1 e_2 e_3 e_4) + G^4 Q_1 + e_2 + e_1 e_2 - e_2 e_3 - e_1 e_2 e_3 + e_2 e_3 e_4 + e_1 e_2 e_3 e_4) + G^3 Q_2(-e_2 + e_3 + e_2 e_3 - e_3 e_4 - e_2 e_3 e_4) + G^2 Q_3(-e_3 + e_4 + e_3 e_4) + G Q_4(-e_4) + Q_{BE}$$

G is the inter-stage gain and $Q_{1,2,3,4}$ are quantization errors of the front-end converter stages. $Q_{BE}$ is the quantization error of the back-end converter stage. The leakage of the front-end quantization errors can be minimized, if the DAC gain errors of the front-end converter stages are all equal. Then, the output reduces to:

$$V_{out} = G^4 V_{in}(1 - e_{dac} + e_{dac}^2 - e_{dac}^3 + e_{dac}^4) + G^4 Q_1 e_{dac}^4 - G^3 Q_2 e_{dac}^3 + G^2 Q_3 e_{dac}^2 - G Q_4 e_{dac} + Q_{BE}$$

In this manner, it may be achieved that, in the described ADC device, the DACs are linearized and the average gain error of all DACs are equal and lower. Therefore, the quantization error leakage may be minimized. The described ADC device may transform the harmonic distortion due to non-linearities of the DACs into white noise. Furthermore, the quantization error leakage due to the gain errors of the DACs may be also transformed into white noise. According to an exemplary embodiment, the present disclosure may be further based on the idea of making the linear gain errors of the DACs equal.

DESCRIPTION OF EXEMPLARY EMBODIMENTS

In the following, further exemplary embodiments of the device and the method will be explained.

According to an embodiment, the control device is configured to perform the swap randomly. By taking this measure, the described technique may be especially efficient.

According to a further embodiment, the control device is configured to randomly shuffle the first unit element values and the second unit element values with each other. In other words, all unit elements values of two or more DACs from different converter stages may be swapped in a random manner.

According to a further embodiment, the control device is configured to generate a first DAC output for the first DAC by selecting the third unit element values, and/or to generate a second DAC output for the second DAC by selecting the fourth unit element values. Thus, the DAC output comprises the (randomly) shuffled DAC unit element values.

According to a further embodiment, at least one of the selections of the unit element values for the DAC output is a random selection. In other words, it may be randomly selected which of the unit element value groups is taken for which DAC.

According to a further embodiment, the ADC device comprises three or more converter stages with respective DACs. According to a further embodiment, the control device is configured to apply the swap (operation) to all unit element values of all DACs. Hence, in an example, all DACs of the ADC device may be taken into account, when swapping the unit element values.

According to a further embodiment, the ADC device comprises three of more converter stages with respective DACs. According to a further embodiment, the control device is configured to apply the swap only to the unit element values of those DACs, where the respective converter stage, in particular a front-end stage, is arranged in an upstream region of the ADC device. Thereby, only those stages that perform a coarse processing may be swapped, while fine processing stages may not be swapped.

In this context, the term "front-end stage" may in particular refer to one or more converter stages that are arranged and/or coupled close to a front-end circuitry. A "front end" may be the circuitry, which comprises in principle the plurality of devices (e.g. filter, amplifier, switches, etc.) that are configured to receive and send signals. In other words, the front-end circuitry may enable the handling of signals from antenna to a subsequent processor (e.g. baseband processor).

According to a further embodiment, the control device is configured to generate a first DAC output for the first DAC and/or a second DAC output for the second DAC by randomly selecting the unit element values after the swap operation.

According to a further embodiment, the control device is configured to process the first unit element values and the second unit element values in form of an array. According to a further embodiment, the first unit element values are processed as a first row or line, and wherein the second unit element values are processed as a second row or line. An array may be a useful and straightforward measure to implement the swap technique.

In an example, the ADC device comprises four front-end DACs, wherein each DAC comprises three unit elements. In the following example array, the first row represents the unit element of the first converter stage DAC, the second row represent the unit elements of the second converter stage DAC, etc.

$$DAC_{array} = \begin{bmatrix} U_{11} & U_{12} & U_{13} \\ U_{21} & U_{22} & U_{23} \\ U_{31} & U_{32} & U_{33} \\ U_{41} & U_{42} & U_{43} \end{bmatrix}$$

In an exemplary example, the rows of the DAC array are randomly swapped. Then, the output of each DAC is built up by randomly selecting K unit elements from the corresponding row. Another option would be to randomly shuffle all elements in the array and then select K unit elements from the array for each DAC. Finally, depending on the system behavior and linearity specifications, the described swap technique may be applied to the first rows only instead of all rows in the DAC array.

According to a further embodiment, the control device is configured to swap randomly the rows or lines of the array, and/or to randomly shuffle all values of the array.

According to a further embodiment, the control device is configured to generate the first or second DAC output by randomly selecting unit element values from the whole array and/or from the first or second row or line.

According to a further embodiment, the swap comprises a dynamic element matching, DEM, technique. See detailed description above.

According to a further embodiment, the ADC is configured as a pipeline ADC, in particular a continuous time pipeline ADC. Hereby, the described technique may be implemented into an industry-relevant and established device in a straightforward manner.

According to a further embodiment, the ADC device is used in a car radar and/or radio product application.

BRIEF DESCRIPTION OF THE DRAWINGS

FIG. 1 illustrates an ADC device in form of a CT pipeline converter according to an exemplary embodiment of the present disclosure.

FIG. 2 illustrates a DAC with DAC unit elements from an ADC according to an exemplary embodiment of the present disclosure.

FIGS. 3a and 3b illustrate the swap of unit element values of DACs from different converter stages according to an exemplary embodiment of the present disclosure.

The illustrations in the drawings are schematic. In different drawings, similar or identical elements are provided with the same reference signs.

DETAILED DESCRIPTION OF THE DRAWINGS

Figure 4:
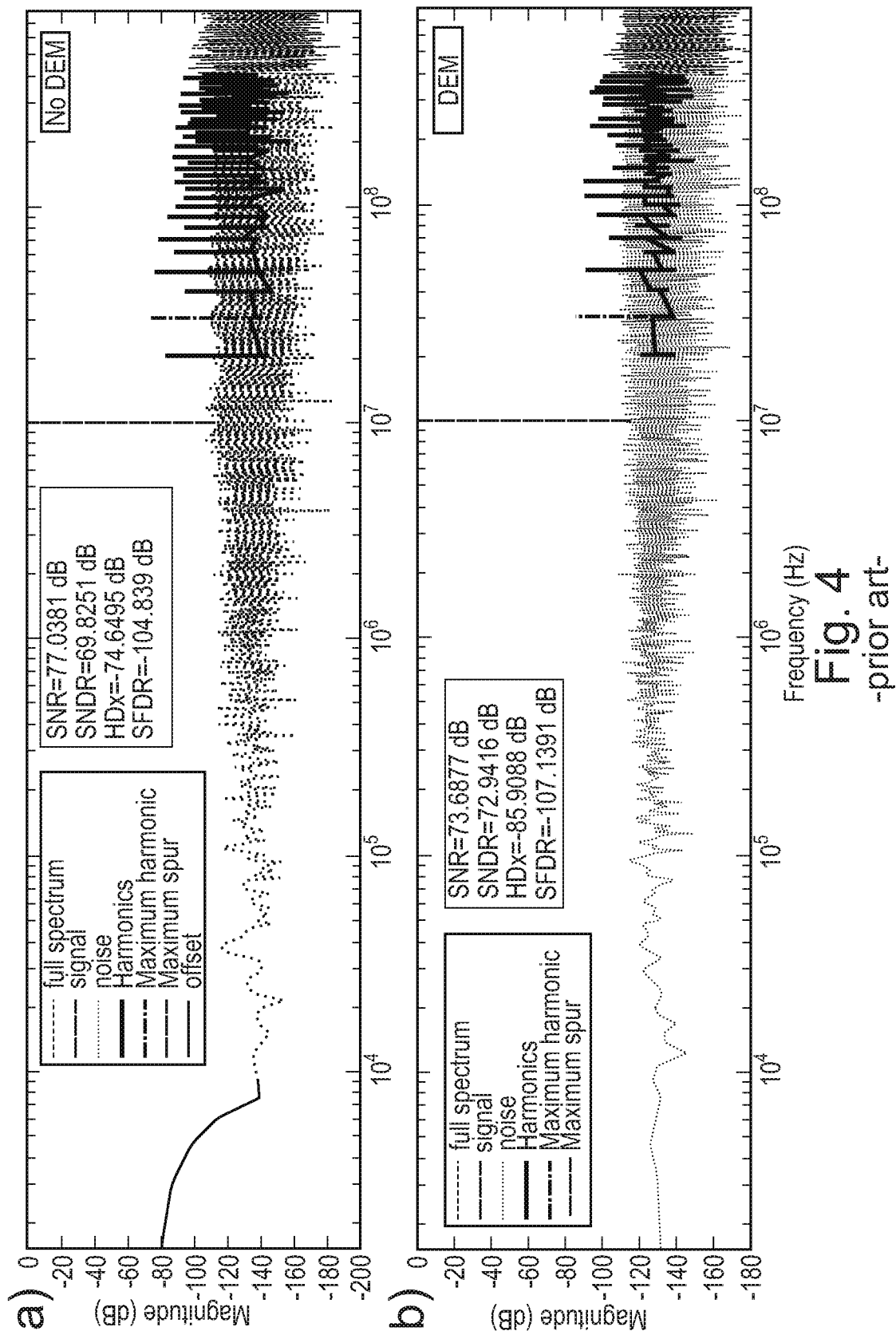
FIGS. 4 and 5 respectively illustrate a simulation of a conventional ADC device.

Before referring to the drawings, exemplary embodiments will be described in further detail, some basic considerations will be summarized based on which exemplary embodiments of the present disclosure have been developed.

According to exemplary embodiments of the present disclosure, there is described a dynamic element matching technique to be employed for the DACs in a continuous time pipeline converter. The proposed DEM method linearizes the DACs and minimizes quantization error leakage at the output of the converter due to the linear gain error of the DACs. The disclosure describes a dynamic element matching (DEM) technique that can be employed for the coarse DACs in the continuous time pipeline converter such that the DACs are linearized and the resulted linear gain errors of the DACs are minimized. The proposed DEM technique reduces the distortion caused by DAC errors without using dithering or calibration as in the prior art.

According to exemplary embodiments of the present disclosure, the described technique led to the following result in comparison to a prior art technique. Table 1 shows the resulted average gain error of the DACs, when the conventional and proposed DEM are applied. It can be seen that, after applying the proposed DEM technique, the average gain errors of the DACs are the same.

TABLE 1

| Average linear gain errors of the DACs when DEM is applied ($\sigma = 0.1\%$) | |
|---|---|
| Average gain error when a conventional DEM is applied | Average gain error when the proposed DEM is applied |
| DAC 1   −0.0145% | 0.0089% |
| DAC 2   0.0287% | 0.0089% |
| DAC 3   −0.0443% | 0.0089% |
| DAC 4   0.0657% | 0.0088% |

In practice, a DAC can exhibit errors caused by mismatching between its unit elements. The actual value of each unit element is assumed to follow a Gaussian distribution with a certain standard deviation a. The DAC errors due to element mismatch can be viewed as introducing constant gain error a and an additive error term e_DAC that is a deterministic non-linear function of the DAC input.

FIG. 1 illustrates an ADC device 100 in form of a CT pipeline converter according to an exemplary embodiment of the present disclosure. The ADC device 100 comprises a plurality of converter stages 110, 120, 130, 140, 150. While the first converter stage 110 is shown in detail, the further (subsequent) converter stages are configured in a comparable manner. The first converter stage 110 comprises a first DAC 115 comprising at least two first unit elements each with a first unit element value (see FIG. 2). In the same manner, the second converter stage 120 (and respectively the subsequent converter stages), comprises a second DAC 125, comprising at least two second unit elements each with a second unit element value.

Not shown is a control device (180, see FIG. 2), coupled to the DACs 115, 116 of the respective converter stages 110, 120, and configured to apply the unit element values of the DACs, and swap these unit element values of the DACs of different converter stages randomly.

Each converter stage 110-150 comprises the respective DAC 115, 125 that generates an analogue output based on the digital input generated by the preceding ADC 112. The output of the DAC 115, 125 is subtracted from a delayed version of the input signal V_in (t) to generate a residue signal. The analogue input signal is delayed by means of continuous time all-pass filter (APF), where the delay provided by the filter matches the delay in the ADC-DAC path. The residue signal (ADC quantization noise, non-linearity and sampling images) is further filtered (LPF) and amplified (G) before it is relayed to the subsequent converter stages 120-150, where the same operation is repeated. Finally, the output of the final converter stage 150 is digitized by a SAR ADC and the final output Y_out is obtained by combining the digital output of each converter stage in digital compensation filters H_k (z). Ideally, the errors related to the front-end DACs 110-140 are cancelled at this stage.

In an exemplary embodiment of the ADC device 100, which has been applied for the simulations described for FIGS. 4 to 13 below, a system level design of a five stages CT pipeline ADC is used, in which the resolution per stage is defined as 2b-2b-2b-2b-6b. The front-end stages (110-140) employs two bits flash ADCs with sampling frequency F_coarse=4.8 GHz. The back-end stage 150 employs six bits SAR ADC with sampling frequency F_backend=1.6 GHz. The target bandwidth is 400 MHz. The input of the coarse DACs 110-140 is a thermometer coded signal. The DACs are built from three unit elements.

FIG. 2 illustrates a DAC 115 of the above-described ADC device 100 in more detail according to an exemplary embodiment of the present disclosure. The first converter stage DAC 115 is coupled to a first converter stage 110 ADC 112 and a control device 180. It can be seen that the first DAC 115 comprises three DAC unit elements (circuits) 116, 117 and 118. Each unit element 116, 117, 118 is associated to a respective unit element value, in this case U1f, U12, U13.

FIGS. 3a and 3b illustrate the swap of unit element values of DACs from different converter stages according to an exemplary embodiment of the present disclosure.

FIG. 3a: first unit element values U11, U12, U13, respectively from first unit elements of the first DAC 115 of the first converter stage 110, are arranged as the first line (line U1) of an array. Second unit element values U21, U22, U23, respectively from second unit elements of the second DAC 125 of the second converter stage 120, are arranged as the second line of the array (line U2).

FIG. 3b: one of the first unit element values (U11) is swapped with one of the second unit element values (U21). Since the first and the second line have now changed, the first line can be termed third unit element values U3 and the second line can be termed forth unit element values U4.

FIG. 4 shows the output spectrum for a 10 MHz input tone simulation, with and without applying a conventional DEM technique (see description above), when a DAC element mismatch of $\sigma$=0.1% is introduced to all DACs. As shown in FIG. 4, mismatch in DAC elements causes harmonic distortion at the output and degrades the linearity performance of the converter. After applying the conventional DEM technique, the linearity performance of the converter is still poor. The conventional DEM technique linearizes the DACs. However, the resulted gain error of the DACs leaks the quantization errors of the front-end ADCs to the output and therefore, reduces the linearity performance of the converter. The upper plot shows the spectrum when no DEM is applied. The lower plot shows the spectrum when conventional DEM is employed to all DACs. Full scale input signal of 10 MHz is applied, FFT points=2^20.

Figure 5:
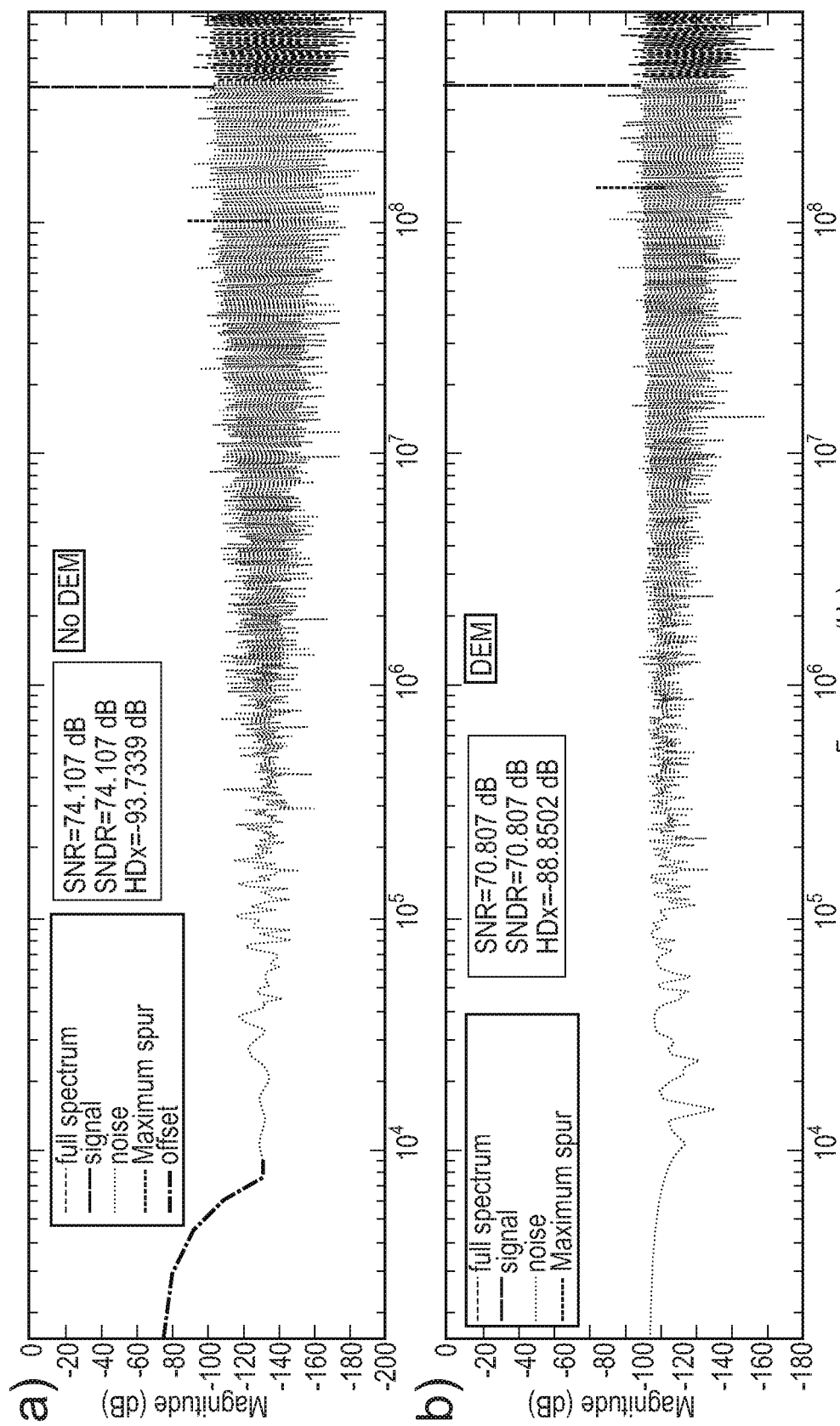

FIG. 5 shows the simulations shown in FIG. 4 for input signal with a frequency of 380 MHz with element mismatch of $\sigma$=0.1% introduced to all DACs. As shown in the Figure, applying the conventional DEM technique to the DACs is not improving the SFDR performance of the converter, as the SFDR is still limited by the linear gain error of the DACs. The upper plot shows the spectrum when no DEM is applied. The lower plot shows the spectrum when conventional DEM is employed to all DACs. Full scale input signal of 380 MHz is applied, FFT points=2^20.

Figure 6:
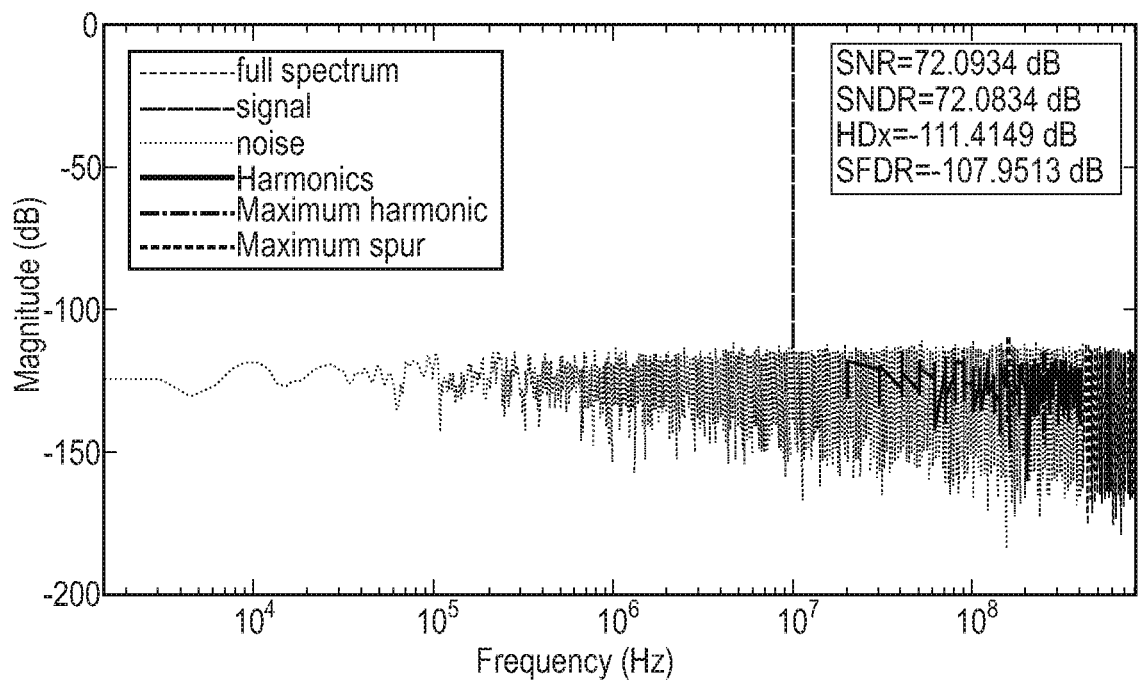
FIGS. 6 to 13 respectively illustrate a simulation of the described ADC device according to an exemplary embodiment of the present disclosure.

FIG. 6 shows an output spectrum with element mismatch of $\delta$=0.1% introduced to all DACs. The swap technique described here is applied to all DACs. A full scale input signal of 10 MHz is applied, FFT points=2^20. As expected, no harmonic tones are present at the output.

Figure 7:
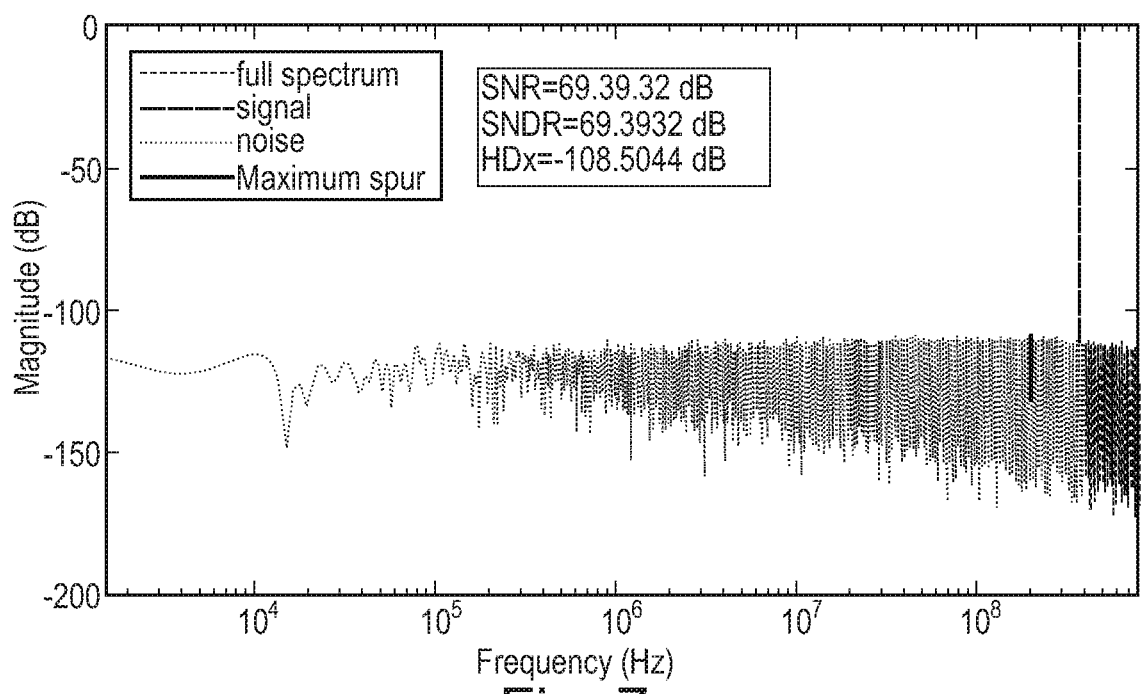

FIG. 7 shows an output spectrum with element mismatch of $\sigma$=0.1% introduced to all DACs. The present disclosure is applied to all DACs. Full scale input signal of 380 MHz is applied, FFT points=2^20. Like in case of FIG. 6, no tones are present and the SFDR is limited to noise floor.

Figure 8:
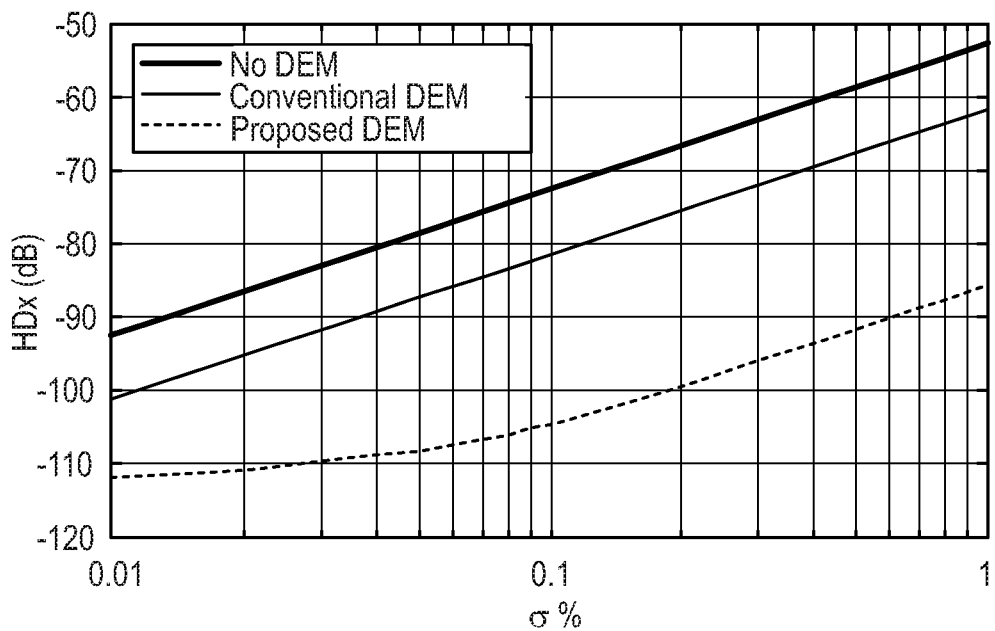

FIG. 8 shows the HDx (dB) versus the DAC element mismatch $\sigma$. According to the present disclosure (proposed DEM technique), no harmonic distortion tones are present at the output and therefore, the HDx is limited to the noise floor only. Each point is the average of 50 runs. Full scale input tone is applied at 10 MHz, FFT size is 2^18. The term "HDx" refers to harmonic distortion, wherein x refers to the largest harmonic tone. For example, if the output spectrum contains a second order harmonic and a third order harmonic, and the power of third order harmonic is larger than the second harmonic, then HDx refers to HD3.

Figure 9:
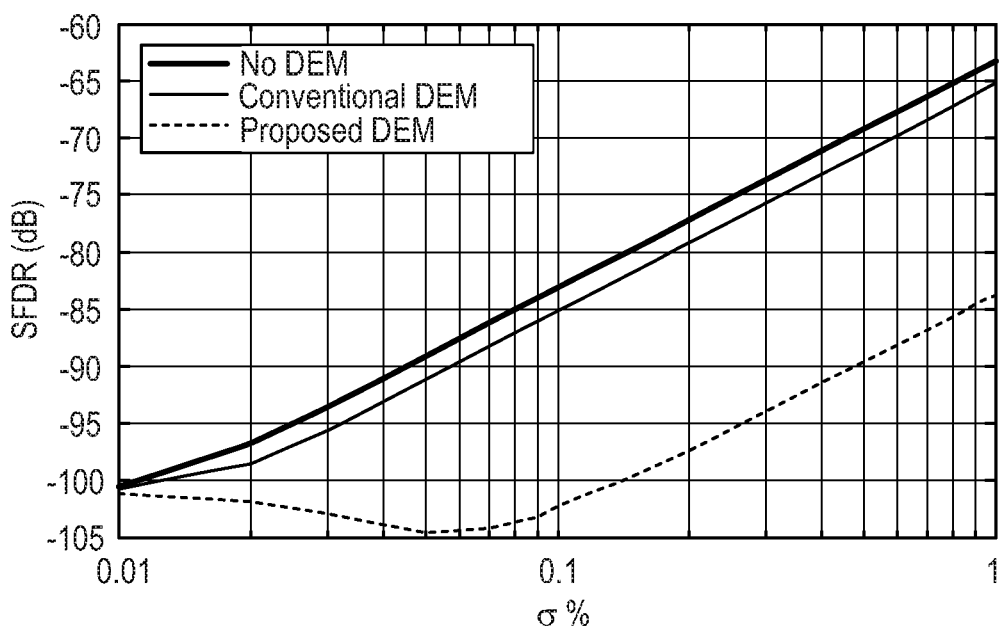

FIG. 9 shows the SFDR (dB) (spurious free dynamic range) versus the DAC element mismatch $\sigma$. Similarly, with the proposed DEM, the output spectrum contains no spurs as the SFDR is limited to the noise floor. Each point is average of 50 runs. Full scale input signal is applied at 380 MHz, FFT size is 2^18.

The results shown in FIGS. 4 and 6 are for an input signal of 10 MHz while the results shown in FIG. 9 are for a 380 MHz input signal. For the sake of better overview, the results of FIGS. 4,5,6 and 7 are summarized in the following tables:

TABLE 2

Results of FIGS. 4 and 6. Fin = 10 MHz and $\sigma$ = 0.1%

|  | Conventional DEM | Proposed DEM |
|---|---|---|
| SNR (dB) | 73.6877 | 72.0934 |
| SNDR (dB) | 72.9416 | 72.0834 |
| HDx (dB) | −85.9088 | −111.4149 |
| SFDR (dB) | −107.1391 | −107.9513 |

TABLE 3

Results of FIGS. 5 and 7. Fin = 380 MHz and σ = 0.1%

|  | Conventional DEM | Proposed DEM |
|---|---|---|
| SNR (dB) | 70.807 | 69.3932 |
| SNDR (dB) | 70.807 | 69.3932 |
| SFDR (dB) | −88.8502 | −108.5044 |

As shown in Table 3, the SFDR is −88.8502 when employing conventional DEM. The SFDR improves to −108.5044 when employing the proposed DEM. These results agree with the results shown in FIG. 9. At low frequencies, the SFDR does not change too much between the conventional and the proposed DEM. However, as the frequency increases, the proposed DEM outperforms the conventional DEM. The proposed DEM improves both HDx and SFDR as further illustrated in FIGS. 10 and 11.

Figure 10:
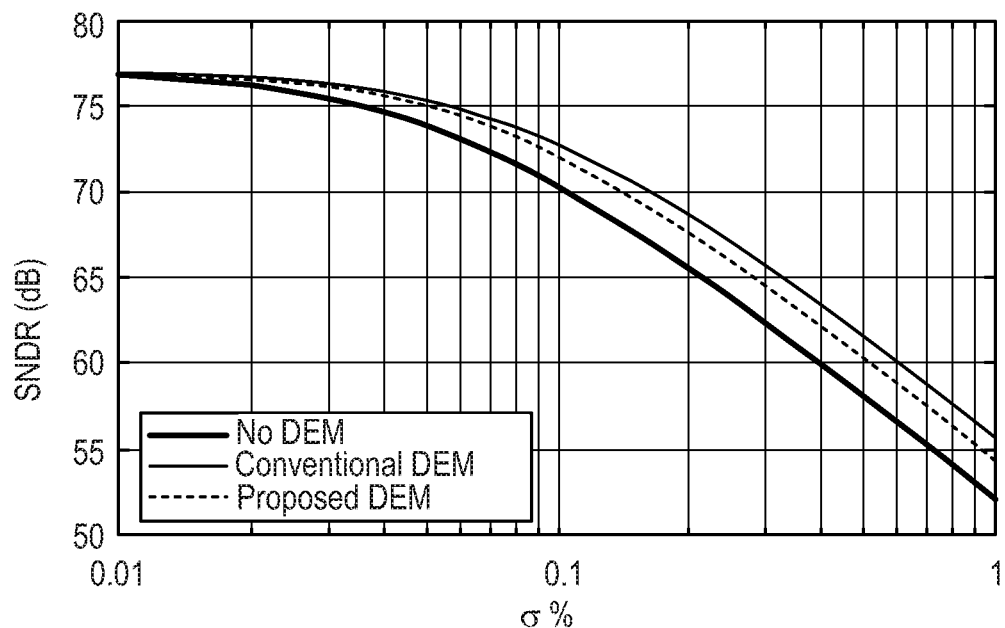

FIG. 10 shows the SNDR (signal to noise and distortion ratio) versus the DAC mismatch σ. Each point is the average of 50 runs. Full scale input tone is applied at 10 MHz, FFT size is 2^18. The proposed DEM has slightly lower SNDR and SNR (signal to noise ratio) than the conventional DEM.

Figure 11:
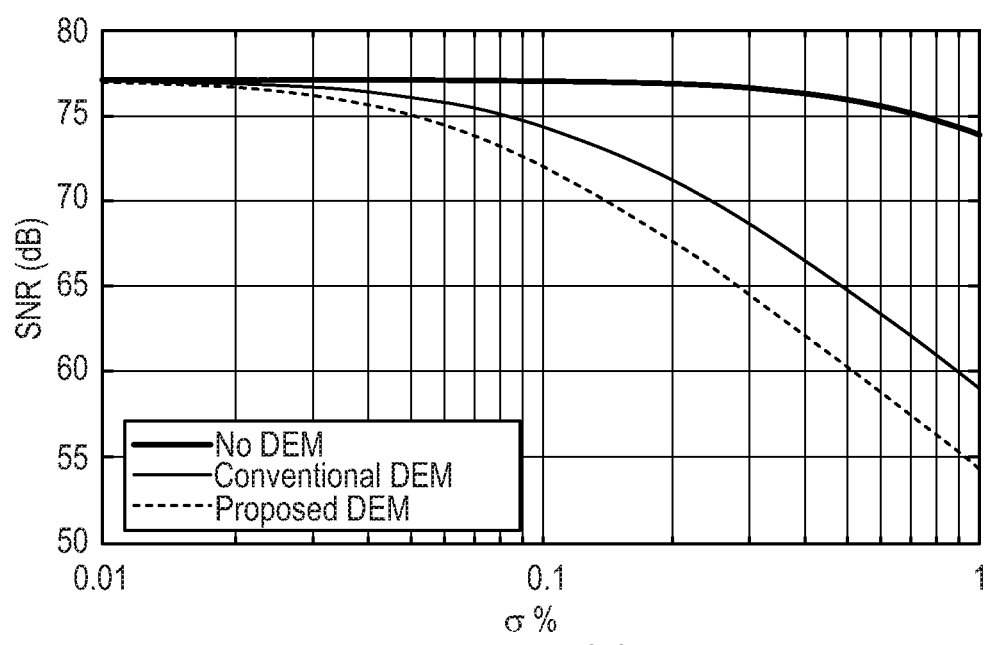

FIG. 11 shows the SNR versus the DAC mismatch σ. Each point is the average of 50 runs. Full scale input tone is applied at 10 MHz, FFT size is 2^18. The proposed DEM has slightly lower SNDR and SNR than the conventional DEM.

Figure 12:
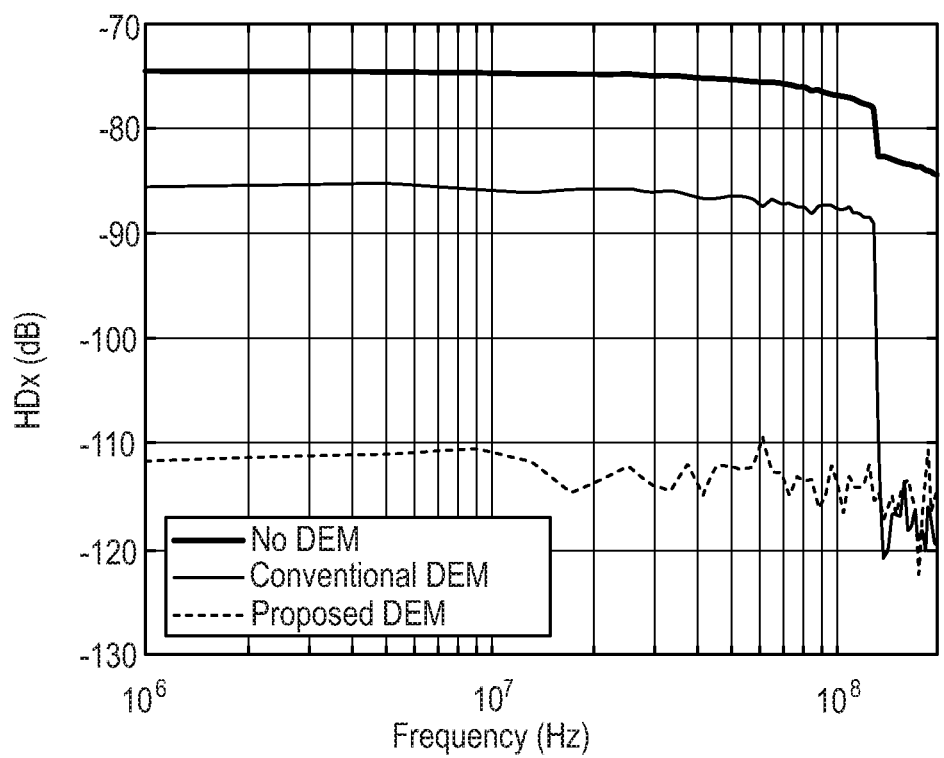

FIG. 12 shows HDx versus the input frequency. Element mismatch of σ=0.1% is introduced to all DACs.

Figure 13:
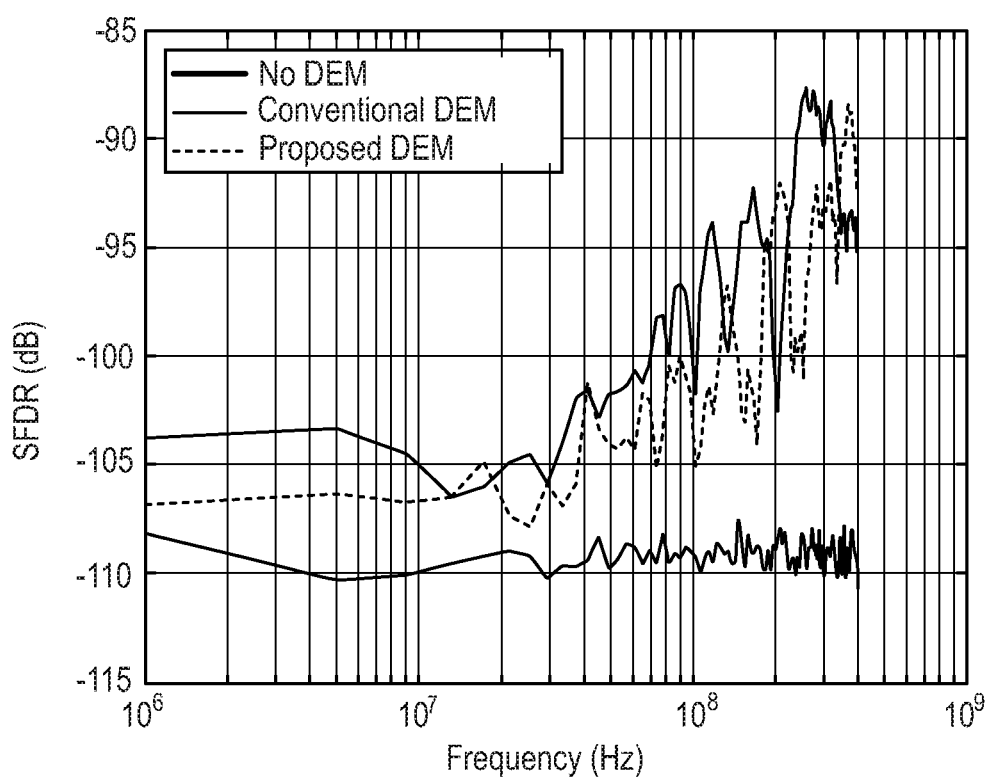

FIG. 13 shows the SFDR versus the input frequency. Element mismatch of σ=0.1% is introduced to all DACs. It is clear that the proposed technique improves SFDR dramatically for high input frequencies.

REFERENCE SIGNS

100 ADC device
101 Input signal, analog
102 Output signal, digital
110 First stage
112 First ADC
115 First DAC
116, 117, 118 First unit elements
120 Second stage
125 Second DAC
130 Third stage
135 Third DAC
140 Fourth stage
145 Fourth DAC
150 Final stage
180 Control device
Ux Unit element value

The invention claimed is:

1. An analog-to-digital converter, ADC, device, comprising:
a first converter stage, comprising
a first digital-to-analog converter, DAC, comprising at least two first unit elements each with a first unit element value; and
a second converter stage, comprising
a second DAC, comprising at least two second unit elements each with a second unit element value;
a control device, coupled to the first DAC and the second DAC and configured to:
swap at least one of the first unit element values with at least one of the second unit element values to obtain corresponding third unit element values and forth unit element values.

2. The ADC device according to claim 1, wherein the control device is configured to perform the swap randomly.

3. The ADC device according to claim 1, wherein the control device is configured to randomly shuffle the first unit element values and the second unit element values with each other.

4. The ADC device according to claim 1,
wherein the control device is configured to at least one of:
generate a first DAC output for the first DAC by selecting the third unit element values;
generate a second DAC output for the second DAC by selecting the fourth unit element values.

5. The ADC device according to claim 4, wherein at least one of the selections is a random selection.

6. The ADC device according to claim 1,
wherein the ADC device comprises three or more converter stages with respective DACs, and
wherein the control device is configured to apply the swap to all unit element values of all DACs.

7. The ADC device according to claim 1,
wherein the ADC device comprises three of more converter stages with respective DACs, and
wherein the control device is configured to apply the swap only to the unit element values of those DACs, where the respective converter stage is arranged in an upstream region of the ADC device.

8. The ADC device according to any one of the preceding claims claim 1,
wherein the control device is configured to generate at least one of a first DAC output for the first DAC by randomly selecting the unit element values, after the swap;
a second DAC output for the second DAC by randomly selecting the unit element values after the swap.

9. The ADC device (100) according to claim 1,
wherein the control device is configured to process the first unit element values and the second unit element values in form of an array.

10. The ADC device according to claim 9,
wherein the control device is configured to at least one of:
swap randomly the rows or lines of the array;
randomly shuffle all values of the array.

11. The ADC device according to claim 9, wherein the control device is configured to generate the first or second DAC output by randomly selecting unit element values from at least one of
the whole array;
the first or second row or line.

12. The ADC device according to claim 1,
wherein the swap comprises a dynamic element matching, DEM, technique.

13. The ADC device according to claim 1,
wherein the ADC is configured as a continuous time pipeline ADC.

14. A method of operating an ADC device having a first digital-to-analog converter, DAC, in a first converter stage, the first DAC comprising at least two first unit elements each with a first unit element value, and a second DAC in a second converter stage, the second DAC comprising at least two second unit elements each with a second unit element value, the method comprising:
providing the first unit element values and the second unit element values, and swapping at least one of the first unit element values with at least one of the second unit element values to obtain corresponding third unit element values and forth unit element values.

15. The method according to claim 14, further comprising using a swap of unit element values from different DACs to linearize the DACs and minimize the gain errors in the context of an ADC device.

16. The method according to claim 14, further comprising randomly shuffling the first unit element values and the second unit element values with each other.

17. The method according to claim 14, further comprising generating a first DAC output for the first DAC by selecting the third unit element values.

18. The method according to claim 14, further comprising generating a second DAC output for the second DAC by selecting the fourth unit element values.

19. The method according to claim 14, further comprising generating a first DAC output for the first DAC by randomly selecting the unit element values after the swapping.

20. The method according to claim 14, further comprising generating a second DAC output for the second DAC by randomly selecting the unit element values after the swap.

* * * * *